United States Patent
Narasimalu et al.

(10) Patent No.: US 7,537,148 B2
(45) Date of Patent: May 26, 2009

(54) BONDING APPARATUS COMPRISING IMPROVED OSCILLATION AMPLIFICATION DEVICE

(75) Inventors: Srikanth Narasimalu, Singapore (SG); Sathish Kumar Balakrishnan, Singapore (SG); Chee Tiong Lim, Singapore (SG)

(73) Assignee: ASM Technology Singapore Pte Ltd., Singapore (SG)

( * ) Notice: Subject to any disclaimer, the term of this patent is extended or adjusted under 35 U.S.C. 154(b) by 489 days.

(21) Appl. No.: 11/250,260

(22) Filed: Oct. 14, 2005

(65) Prior Publication Data

US 2007/0084900 A1   Apr. 19, 2007

(51) Int. Cl.
 *B23K 1/06* (2006.01)
(52) U.S. Cl. .............. 228/1.1; 228/110.1; 228/4.5; 228/180.5; 156/73.1

(58) Field of Classification Search ................ 228/1.1, 228/4.5, 110.1, 180.5; 156/73.1, 580.1
See application file for complete search history.

(56) References Cited

U.S. PATENT DOCUMENTS 5,385,288 A * 1/1995 Kyomasu et al. ............ 228/1.1

* cited by examiner

*Primary Examiner*—Kiley Stoner
*Assistant Examiner*—Erin B Saad
(74) *Attorney, Agent, or Firm*—Ostrolenk, Faber, Gerb & Soffen, LLP

(57) ABSTRACT

A bonding apparatus such as an ultrasonic transducer is provided that comprises an oscillation amplification device having a longitudinal axis and a substantially triangular cross-sectional area on a plane that is orthogonal to the longitudinal axis. An ultrasonic driver is coupled to the oscillation amplification device at a first position along the longitudinal axis and a bonding tool is mounted to the oscillation amplification device at a second position along the longitudinal axis spaced from the first position.

10 Claims, 4 Drawing Sheets

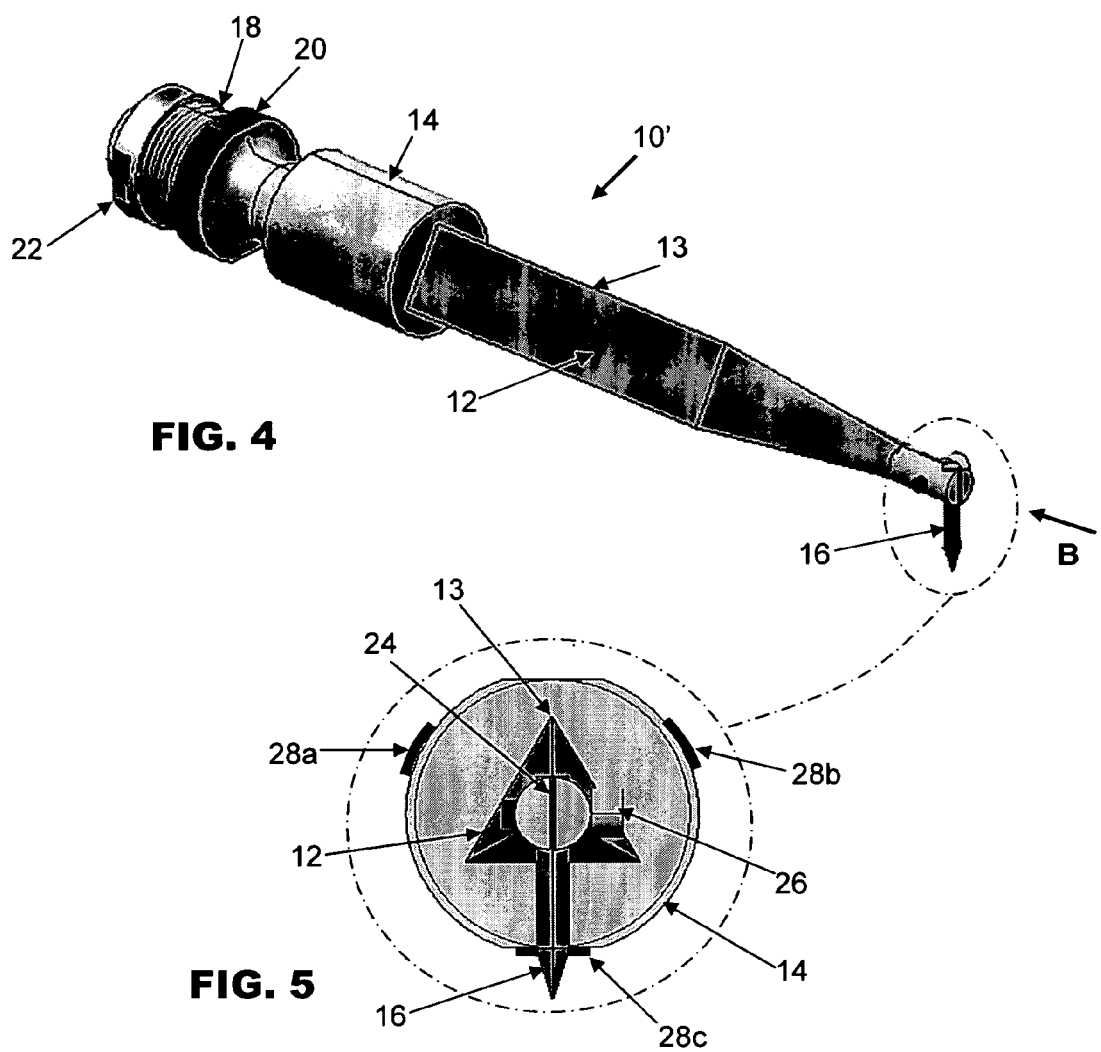

BONDING APPARATUS COMPRISING IMPROVED OSCILLATION AMPLIFICATION DEVICE

FIELD OF THE INVENTION

The invention relates to a bonding apparatus which comprises an amplification device such as a horn for transmitting energy generated from a driver to a bonding site, and in particular, to an ultrasonic bonding apparatus.

BACKGROUND AND PRIOR ART

Bonding apparatus, such as those used in the semiconductor assembly industry, commonly rely on ultrasonic energy for bonding electrically conductive wire to electrical contact pads.

FIG. 1 is a side view of a conventional ultrasonic transducer 100 of the prior art that is now widely available in the market. The conventional ultrasonic transducer 100 comprises a horn 102 with a substantially circular cross-section on which is located a mounting barrel 104 consisting of a hollow cylinder for mounting the transducer 100. Other conventional ultrasonic transducers may comprise horns that have generally rectangular cross-sections. Ultrasonic energy is produced by driving means, which may comprise an ultrasonic driver 108 coupled to the horn by securing it between a front plate 110 and a back plate 112 of the transducer 100. The front plate 110, ultrasonic driver 108 and back plate 112 may be compressed together using an axial bolt (not shown) under high torque. A bonding tool, such as a capillary 106, is attached to the tip of the horn 102 at an opposite end of the horn 102 away from the location of the ultrasonic driver 108.

During operation, a set of piezoelectric discs comprised in the ultrasonic driver 108 is subjected to an alternating electrical signal which causes the discs to expand and contract according to the signal. Consequently, an ultrasonic wave is generated at the applied frequency of the electrical signal. Since the wave produced has a small amplitude, an amplifying device (in this case the horn 102) is required before the wave is passed to the bonding tool such as the capillary 106.

The horn 102 is usually constructed with a decreasing cross-sectional area along the axis of the transducer 100 towards the capillary 106. The ultrasonic energy that is transmitted causes the capillary 106 to oscillate parallel to the longitudinal axis of the horn 102. The ultrasonic energy at the tip of the capillary 106 is applied to wire that is fed through the capillary 106 at the bonding site whereby to weld the wire to a bonding surface at the bonding site during wire bonding.

As noted above, the horn 102 of such a conventional ultrasonic transducer 100 has a generally circular cross-section throughout. During bonding, the horn 102 is subjected to bending loads as the transducer 100 is lifted up and down during the bonding process. Moreover the transducer 100 undergoes continuous resonance during operation. It is hence held at node locations by using a thin web of material that connects the horn 102 to the barrel 104 at a node location of a standing ultrasonic wave within the horn 102 generated by the activated ultrasonic driver 108. Generally, the transducer 100 is held on a bonding system by clamping it on the barrel 104 such that strain is transferred to the horn and the ultrasonic driver. As a result, considerable strain is caused on the horn 102 during operation.

While horns with circular or rectangular cross-sections are generally adequate for wire-bonding applications and are widely used, there is nevertheless a desire to further improve the performance of the transducer 100, such as by improving the oscillatory efficiency and amplification characteristics of the transducer at the capillary 106.

SUMMARY OF THE INVENTION

It is thus an object of the invention to seek to provide an ultrasonic transducer with an improved amplification device that is suitable for use in the propagation of ultrasonic energy in an ultrasonic transducer.

According to a first aspect of the invention, there is provided a bonding apparatus comprising: an oscillation amplification device having a longitudinal axis; an ultrasonic driver coupled to the oscillation amplification device at a first position along the longitudinal axis; and a bonding tool mounted to the oscillation amplification device at a second position along the longitudinal axis spaced from the first position; wherein the oscillation amplification device has a substantially triangular cross-sectional area on a plane that is orthogonal to the longitudinal axis.

According to a second aspect of the invention, there is provided an ultrasonic transducer comprising: a horn having a longitudinal axis; an ultrasonic driver coupled to the horn at a first position along the longitudinal axis; and a bonding tool mounted to the horn at a second position along the longitudinal axis spaced from the first position; wherein the horn has a substantially triangular cross-sectional area on a plane that is orthogonal to the longitudinal axis.

According to a third aspect of the invention, there is provided an oscillation amplification device comprising: a horn having a longitudinal axis; an oscillation generation portion at a first position of the horn along the longitudinal axis for coupling an ultrasonic driver; and a bonding portion at a second position of the horn along the longitudinal axis that is spaced from the first position for mounting a bonding tool; wherein the horn has a substantially triangular cross-sectional area on a plane that is orthogonal to the longitudinal axis.

It would be convenient hereinafter to describe the invention in greater detail by reference to the accompanying drawings which illustrate one embodiment of the invention. The particularity of the drawings and the related description is not to be understood as superseding the generality of the broad identification of the invention as defined by the claims.

BRIEF DESCRIPTION OF THE DRAWINGS

Examples of preferred embodiments of an apparatus in accordance with the invention will now be described with reference to the accompanying drawings, in which:

FIG. 4 is an isometric view of an ultrasonic transducer according to a second preferred embodiment of the invention;

FIG. 5 is a side view of the ultrasonic transducer according to the second preferred embodiment, looking along the longitudinal axis of the horn from direction B in FIG. 4;

DETAILED DESCRIPTION OF THE PREFERRED EMBODIMENTS OF THE INVENTION

Figure 2:
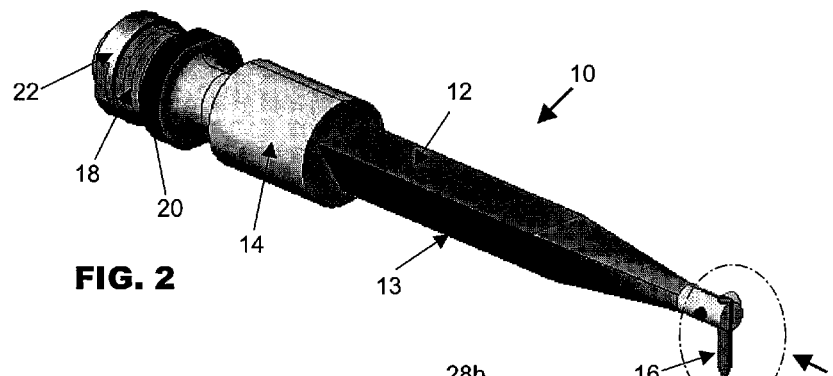
FIG. 2 is an isometric view of an ultrasonic transducer according to a first preferred embodiment of the invention.

FIG. 2 is an isometric view of a bonding apparatus such as an ultrasonic transducer 10 according to a first preferred embodiment of the invention. The ultrasonic transducer 10 comprises an oscillation amplification device in the form of a horn 12 having a longitudinal axis parallel to and running along the length of the horn 12. A mounting barrel 14 is located on the horn 12 and may be in the form of a hollow cylinder.

The horn 12 has an oscillation generation portion at a first position of the horn 12 along the longitudinal axis for coupling an ultrasonic driver. This first position is preferably at one end of the horn 12 where an ultrasonic driver 18 is secured between a front plate 20 and a back plate 22. The ultrasonic driver 18 is configured to transmit oscillatory vibration along the horn 12 in directions parallel to the longitudinal axis.

The horn 12 also has a bonding portion as a second position of the horn 12 along the longitudinal axis spaced from the first position for mounting a bonding tool. A bonding tool such as a capillary 16 is attached to a tip of the horn 12 at the second position, preferably at an opposite end of the horn 12 to the ultrasonic driver 18.

As can be seen from FIG. 2, the horn 12 has a generally triangular cross-section on a plane that is orthogonal to the longitudinal axis of the transducer 10. The triangular cross-section has three vertices, with one vertex 13 oriented substantially in the same direction as the orientation of the capillary 16. Therefore, the said vertex 13 is facing the bonding surface. Preferably, the triangle is an isosceles triangle and more preferably, the triangle is an equilateral triangle.

Figure 3:
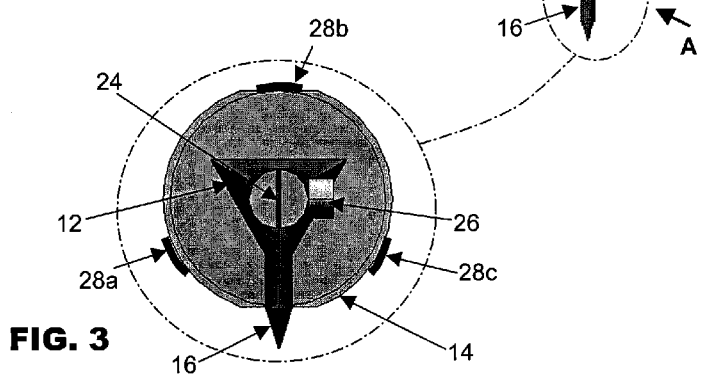
FIG. 3 is a side view of the ultrasonic transducer according to the first preferred embodiment, looking along the longitudinal axis of the horn from direction A in FIG. 2.

FIG. 3 is a side view of the ultrasonic transducer 10 according to the first preferred embodiment, looking along the longitudinal axis of the horn 12 from direction A in FIG. 2. This view shows a slit 24 formed at the tip of the horn 12 to accommodate the capillary 16. Although the tip of the horn 12 is presented as substantially circular in cross-section, other shapes such as triangular or quadrilateral shapes at the tip of the horn 12 are also possible. Once the capillary 16 is placed in position within the slit 24, the slit 24 is closed onto the capillary 16 and tightened with a screw 26 to secure the capillary 16 in place for wire bonding operations.

FIG. 3 also illustrates clamping positions 28a-c at which the ultrasonic transducer 10 is clamped to a bond head (not shown). Each clamping position 28a, 28b and 28c is preferably clamping the mounting barrel away from the vertices of the triangle, such that each clamping position is generally aligned with a side of the triangle.

Preferably, the clamping positions 28a-c are located at approximately 60-degree offsets from each vertex of the triangle. Each clamping position 28a, 28b, 28c includes two clamping points that are aligned with each other along the barrel 14 parallel to the longitudinal axis of the transducer 10. Therefore, the barrel 14 preferably has a total of six clamping points. This arrangement enables strain transfer to the horn 12 and ultrasonic driver 18 from the barrel-clamping arrangement to be reduced. An advantage of this clamping arrangement is to serve to reduce the impedance changes of the transducer 10 observed between clamped and unclamped states of the transducer 10.

FIG. 4 is an isometric view of an ultrasonic transducer 10' according to a second preferred embodiment of the invention. The set-up of this ultrasonic transducer 10' is similar to that of the ultrasonic transducer 10 of the first embodiment. It comprises a horn 12 extending from an ultrasonic driver 18 secured between a front plate 20 and a back plate 22 at one end of the horn 12, and a capillary 16 attached to a tip of the horn 12 at an opposite end of the horn 12.

However, the difference between the first and second preferred embodiments is that a vertex 13 of the triangular cross-section of the horn 12 is oriented in an opposite direction as compared to the orientation of the capillary 16. Accordingly, the said vertex 13 is facing away from a bonding surface. Instead, a side of the triangle is facing the bonding surface.

FIG. 5 is a side view of the ultrasonic transducer 10' according to the second preferred embodiment, looking along the longitudinal axis of the horn 12 from direction B in FIG. 4. It shows clamping positions 28a-c on the mounting barrel 14 for attaching the ultrasonic transducer 10' to a bond head (not shown). Similar to the first preferred embodiment of the invention, each clamping position 28a, 28b and 28c is preferably aligned with a side of the triangle of the horn 12. Accordingly, the clamping positions 28a-c have shifted from that of the first preferred embodiment because the orientation of the vertices of the triangular cross-section of the horn has changed. Similar to the previous embodiment, the clamping positions 28a-c may comprise a total of six clamping points, with two clamping points at each clamping position.

In tests performed on both the transducers 10, 10' according to the preferred embodiments of the invention, the first preferred embodiment was found to present greater stiffness and minimal impedance change due to strain during bonding as compared to the second preferred embodiment, although both show similar performance characteristics in other respects. Thus, the first embodiment is preferred over the second embodiment, although both may be implemented.

Figure 1:
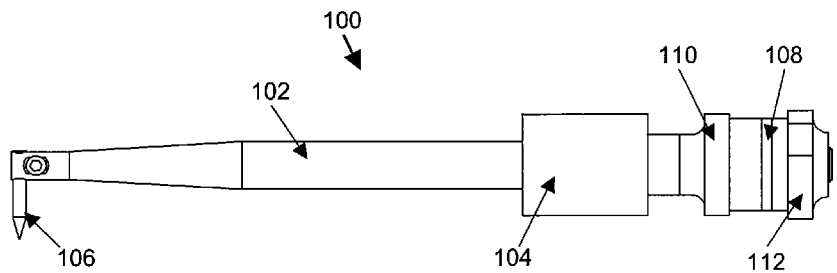
FIG. 1 is a side view of an ultrasonic transducer of the prior art.
Figure 6:
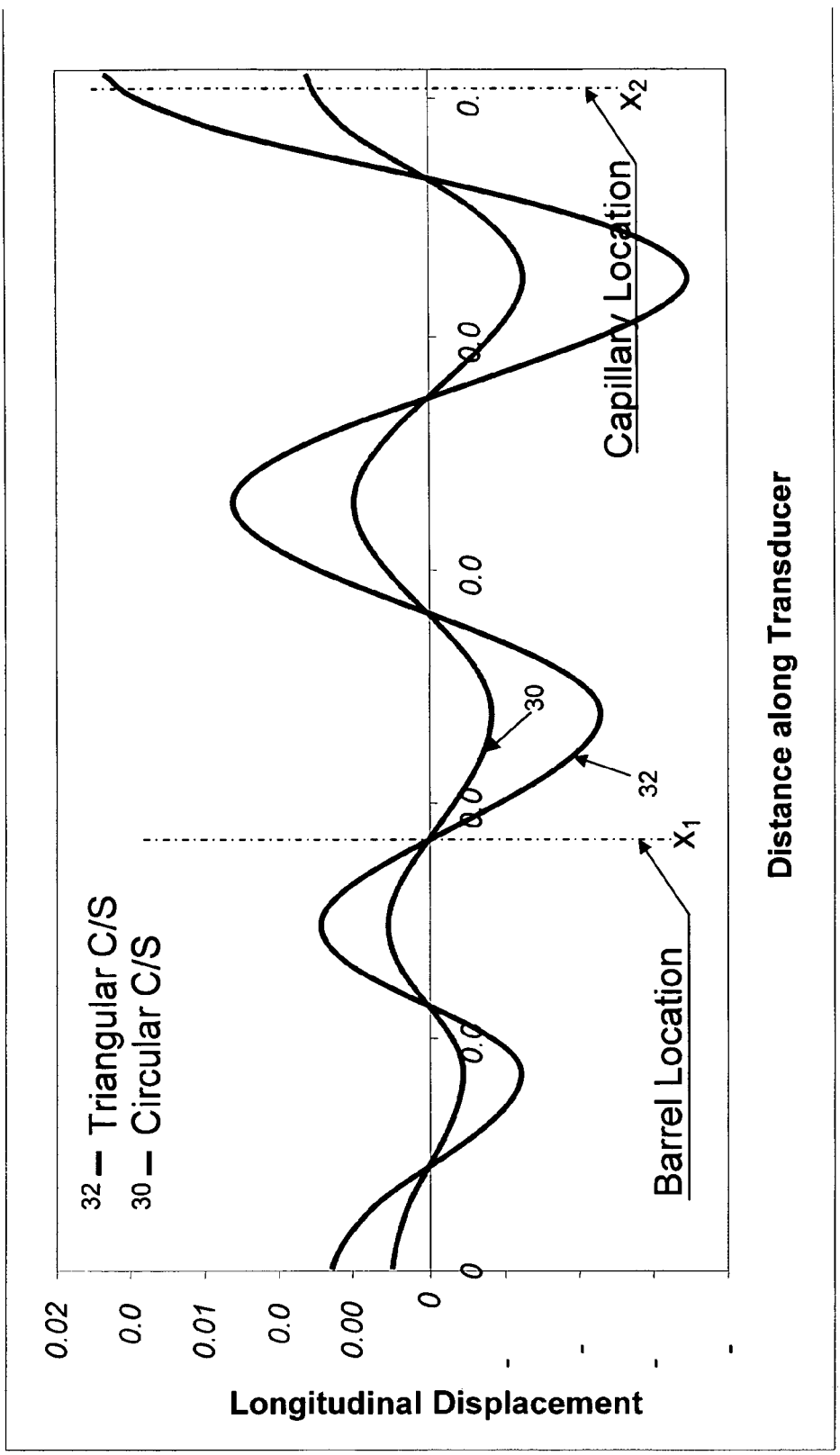
FIG. 6 is a graph showing a comparison between ultrasonic vibration amplitudes obtained when operating a conventional transducer according to FIG. 1 as compared to an ultrasonic transducer according to FIG. 2.

FIG. 6 is a graph showing a comparison between ultrasonic vibration amplitudes obtained when operating a conventional transducer with a circular cross-section 100 according to FIG. 1 as compared to an ultrasonic transducer 10 according to FIG. 2. A first graph 30 shows the operational amplitude of the conventional ultrasonic transducer 100 with a circular cross-sectioned horn 102, and a second graph 32 shows the operational amplitude of an ultrasonic transducer 10 with a triangular cross-sectioned horn 12 according to the first preferred embodiment of the invention. The graphs show the longitudinal displacement at each point of the respective transducer along their lengths when operated at a frequency of approximately 138 kHz.

Point $x_1$ corresponds approximately to the position whereat the mounting barrel 14 is connected to the horn 12, whereas point $x_2$ corresponds to the position of the capillary. At point $x_2$, which is the operationally important part of the transducer where ultrasonic energy is applied for wire bonding, the longitudinal displacement of the capillary shows a marked increase for the transducer 10 applying a horn with a triangular cross-section. In the example, the increase in longitudinal displacement using the new transducer 10 is about four times or more as compared to that of a conventional transducer 100. Thus, the ultrasonic transducer 10 according to the first preferred embodiment of the invention is more effective than the conventional transducer 100 for welding wire to bonding surfaces.

Figure 7:
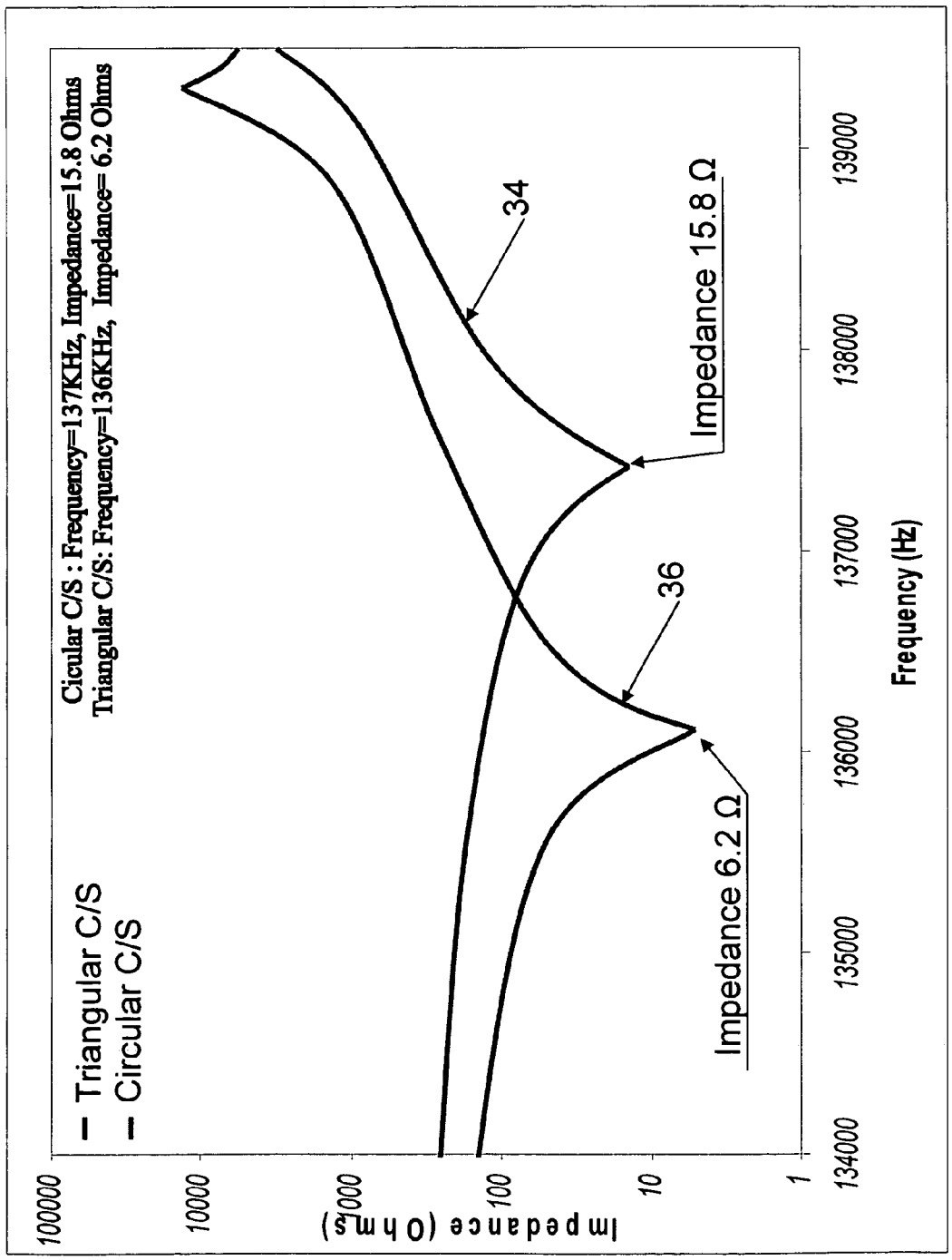
FIG. 7 is a graph showing a comparison between impedance variations when operating a conventional transducer according to FIG. 1 as compared to an ultrasonic transducer according to FIG. 2.

FIG. 7 is a graph showing a comparison between impedance variations when operating a conventional transducer 100 according to FIG. 1 as compared to an ultrasonic transducer according to FIG. 2. A first graph 34 shows impedance variations of the ultrasonic transducer 100 of the prior art when it is operated at a selected range of frequencies. A second graph 36 shows impedance variations of the ultrasonic transducer 10 according to the first preferred embodiment when it is operated at the same selected range of frequencies.

At frequency f2 (about 137 kHz), the minimum impedance of the conventional ultrasonic transducer 100 is at 15.8 Ω. At frequency f1 (about 136 kHz), the minimum impedance of the ultrasonic transducer 10 according to the invention is at 6.2 Ω. During construction of a transducer, the operational frequency of the transducer can be modified since it relates to the length of the transducer and the speed of sound. Thus, the new transducer 10 can also be constructed to operate at frequency f2 like the conventional transducer 100, but the new transducer 10 would have a lower minimum impedance value. Accordingly, the minimum overall impedance of the conventional ultrasonic transducer 100 is much higher than the minimum overall impedance of the new transducer 10, such that the conventional ultrasonic transducer 100 is less efficient in transforming the applied electrical energy into mechanical energy. Furthermore, since the heat induced in the piezoelectric motor is proportional to the impedance, the new transducer 10 will have reduced heat emission as compared to the conventional transducer 100.

It would be appreciated that the preferred embodiments of the invention provide ultrasonic transducers that have lower mass and inertia, so that less energy is required to move the transducers during bonding. They also have better ultrasonic amplification characteristics as compared to conventional ultrasonic transducers that have horns with circular or rectangular cross-sections. The increase in ultrasonic vibration amplitude at the capillary tip from the same motor source is significant compared to the conventional design.

Besides a reduction in overall impedance of the transducer compared to conventional transducers resulting in more efficiency, the impedance change before and after clamping is minimal, so that the transducer can function more consistently. By making the body of the horn 12 dynamically more rigid through the use of horns with triangular cross-sections, it enables lesser unwanted vibrations at the tip of the capillary 16 during bonding operations. Furthermore, in order to obtain the aforementioned advantages, a horn 12 having a triangular cross-section is not difficult to manufacture and/or machine. It can be manufactured, for example, by milling the horn 12 at three angles to form a triangular cross-section at the relevant portion of the horn 12. Thus, the invention may be implemented on existing bonding systems without undue difficulty.

The invention described herein is susceptible to variations, modifications and/or additions other than those specifically described and it is to be understood that the invention includes all such variations, modifications and/or additions which fall within the spirit and scope of the above description.

The invention claimed is:

1. A bonding apparatus comprising:
    an oscillation amplification device having a longitudinal axis;
    a mounting barrel coupled to the oscillation amplification device;
    an ultrasonic driver coupled to the oscillation amplification device at a first position along the longitudinal axis; and
    a bonding tool mounted to the oscillation amplification device at a second position along the longitudinal axis spaced from the first position;
    wherein the oscillation amplification device has a substantially triangular cross-sectional area on a plane that is orthogonal to the longitudinal axis,
    the bonding apparatus further comprising a clamp that is configured to clamp the mounting barrel at clamping positions located away from the vertices of the triangular cross-sectional area such that each clamping position is generally aligned with a side of the triangle.

2. A bonding apparatus as claimed in claim 1, wherein the triangular cross-sectional area has a vertex that is oriented in substantially the same direction as the orientation of the bonding tool.

3. A bonding apparatus as claimed in claim 1, wherein the triangular cross-sectional area has a vertex that is oriented in substantially an opposite direction as compared to the orientation of the bonding tool.

4. A bonding apparatus as claimed in claim 1, wherein the shape of the triangular cross-sectional area is an isosceles triangle.

5. A bonding apparatus as claimed in claim 4, wherein the shape of the triangular cross-sectional area is an equilateral triangle.

6. A bonding apparatus as claimed in claim 1, wherein each clamping position is located at an approximately 60-degree offset from a vertex of the triangle.

7. A bonding apparatus as claimed in claim 1, wherein each clamping position comprises two clamping points that are aligned with each other parallel to the longitudinal axis of the oscillation amplification device.

8. A bonding apparatus as claimed in claim 1, wherein the ultrasonic driver is configured to transmit oscillatory vibration along the oscillation amplification device in directions parallel to the longitudinal axis.

9. An ultrasonic transducer comprising:
    a horn having a longitudinal axis;
    a mounting barrel coupled to the horn;
    an ultrasonic driver coupled to the horn at a first position along the longitudinal axis; and
    a bonding tool mounted to the horn at a second position along the longitudinal axis spaced from the first position;
    wherein the horn has a substantially triangular cross-sectional area on a plane that is orthogonal to the longitudinal axis,
    the ultrasonic transducer further comprising a clamp that is configured to clamp the mounting barrel at clamping positions located away from the vertices of the triangular cross-sectional area such that each clamping position is generally aligned with a side of the triangle.

10. An oscillation amplification device comprising:
    a horn having a longitudinal axis;
    an oscillation generation portion of the horn at a first position of the horn along the longitudinal axis for coupling an ultrasonic driver; and
    a bonding portion of the horn at a second position of the horn along the longitudinal axis for mounting a bonding tool, the second position being spaced from the first position;
    wherein the horn has a substantially triangular cross-sectional area on a plane that is orthogonal to the longitudinal axis, a mounting barrel is coupled to the horn, and a clamp is configured to clamp the mounting barrel at clamping positions located away from the vertices of the triangular cross-sectional area such that each clamping position is generally aligned with a side of the triangle.

* * * * *